US010438902B2

(12) United States Patent
McGahay et al.

(10) Patent No.: US 10,438,902 B2
(45) Date of Patent: Oct. 8, 2019

(54) ARC-RESISTANT CRACKSTOP

(71) Applicant: GLOBALFOUNDRIES INC., Grand Cayman (KY)

(72) Inventors: Vincent J. McGahay, Poughkeepsie, NY (US); Nicholas A. Polomoff, Irvine, CA (US); Shaoning Yao, Chappaqua, NY (US); Anupam Arora, Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 16 days.

(21) Appl. No.: 15/698,027

(22) Filed: Sep. 7, 2017

(65) Prior Publication Data

US 2019/0074253 A1 Mar. 7, 2019

(51) Int. Cl.

| | |
|---|---|
| ***H01L 23/00*** | (2006.01) |
| ***H01L 23/62*** | (2006.01) |
| ***H01L 23/66*** | (2006.01) |

(52) U.S. Cl.

CPC ............ *H01L 23/562* (2013.01); *H01L 23/62* (2013.01); *H01L 23/66* (2013.01); *H01L 2223/6605* (2013.01)

(58) Field of Classification Search

CPC ................................ H01L 23/62; H01L 23/66

See application file for complete search history.

(56) References Cited

U.S. PATENT DOCUMENTS

| | | | |
|---|---|---|---|
| 6,261,945 B1 | 7/2001 | Nye, III et al. | |
| 7,145,211 B2 | 12/2006 | Mallikarjunaswamy et al. | |
| 7,718,514 B2 | 5/2010 | Tessier et al. | |
| 7,795,615 B2 * | 9/2010 | Goebel | H01L 23/5223 257/48 |
| 7,851,860 B2 | 12/2010 | Yue et al. | |
| 2006/0055007 A1 | 3/2006 | Yao et al. | |
| 2007/0115606 A1 | 5/2007 | DeVries et al. | |
| 2007/0262305 A1 | 11/2007 | Adkisson et al. | |
| 2010/0078777 A1 | 4/2010 | Barth et al. | |
| 2010/0200958 A1 * | 8/2010 | Angyal | H01L 23/562 257/619 |
| 2012/0074519 A1 | 3/2012 | Yao et al. | |

(Continued)

FOREIGN PATENT DOCUMENTS

| | | |
|---|---|---|
| TW | 200612518 | 4/2006 |
| TW | 200924070 | 6/2009 |
| WO | 2014132242 | 9/2014 |

OTHER PUBLICATIONS

Taiwanese Office Action and Search Report in related TW Application No. 106142398, dated Sep. 28, 2018, 10 pages.

(Continued)

*Primary Examiner* — Hoa B Trinh

(74) *Attorney, Agent, or Firm* — Anthony Canale; Andrew M. Calderon; Roberts Mlotkowski Safran Cole & Calderon, P.C.

(57) ABSTRACT

The present disclosure relates to semiconductor structures and, more particularly, to arc resistant crackstop structures and methods of manufacture. The structure includes: a crackstop structure comprising dual rails surrounding an active area of an integrated circuit; and a through-BOx electrical contact electrically connecting each of the dual rails to an underlying substrate.

17 Claims, 2 Drawing Sheets

100 125 120 130 "A" "A" 110 135 105 115 140

(56) References Cited

U.S. PATENT DOCUMENTS

| | | | | |
|---|---|---|---|---|
| 2012/0091455 | A1 * | 4/2012 | Chen | H01L 22/32<br>257/48 |
| 2014/0264767 | A1 * | 9/2014 | Gratz | H01L 21/78<br>257/620 |
| 2017/0229362 | A1 * | 8/2017 | Fitzsimmons | H01L 23/26 |

OTHER PUBLICATIONS

Taiwanese Office Action and Search Report in related TW Application No. 106142398, dated Apr. 23, 2019, 10 pages.

Taiwanese Notice of Allowance in related TW Application No. 106142398, dated Jul. 26, 2019, 4 pages.

* cited by examiner

ARC-RESISTANT CRACKSTOP

FIELD OF THE INVENTION

The present disclosure relates to semiconductor structures and, more particularly, to arc resistant crackstop structures and methods of manufacture.

BACKGROUND

Crackstop structures are formed in dielectric material around an active area of a chip to prevent cracks from propagating into the active area. The crackstop structures can be edge seal structures which prevent ingress of moisture and oxidation into the active area of the chip.

The crackstop structures are typically large metal loop structures. These structures, though, are susceptible to arcing during plasma etch during semiconductor fabrication. Arcing susceptibility is further increased for high resistivity SOI substrates used in RF technologies. For example, high resistivity substrates (used in RF technologies) promote plasma non-uniformities/instabilities leading to arcing and device charging. Arcing damage also often occurs between adjacent metal structures which are not electrically connected. This is particularly a concern in dual rail crackstop structures, which exhibit arcing between adjacent rails or to adjacent metal structures.

SUMMARY

In an aspect of the disclosure, a structure comprises: a crackstop structure comprising dual rails surrounding an active area of an integrated circuit; and a through-BOx electrical contact electrically connecting each of the dual rails to an underlying substrate.

In an aspect of the disclosure, a structure comprises: non-intersecting metal crackstop rails comprising an outer crackstop structure surrounding an active area of an integrated circuit and an inner crackstop structure surrounding the active area of the integrated circuit; and a through-BOx electrical contact electrically connecting each of the outer crackstop structure and the inner crackstop structure to an underlying substrate of silicon-on-insulator technology.

In an aspect of the disclosure, a method comprises forming a through-BOx electrical contact through an insulator layer and semiconductor layer of an SOI technology to electrically connect non-intersecting metal crackstop rails to an underlying substrate.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to arc resistant crackstop structures and methods of manufacture. More specifically, the present disclosure describes a dual rail crackstop structure in which the rails share a BOx (BI) contact. Advantageously, the shared BOx contacts allow the rails to float to the same electrical potential, thereby reducing or even eliminating arcing between rails.

In embodiments, the arc resistant crackstop structure described herein is dual rail crackstop structure which can act as moisture/oxidation barriers. Also, in embodiments, the dual rail crackstop structure can act as edge seal structures. The dual rail crackstop structure comprises two non-intersecting metal crackstop rails comprised of conductive material. A through-BOx electrical contact is electrically connected to the two non-intersecting metal crackstop rails, and electrically connected to the substrate. In this configuration, it is now possible to avoid rail-to-rail arcing of crackstops by allowing the rails to float to the same potential by a common contact to the substrate, as well as avoid loss of crackstop redundancy by not connecting the rails to each other directly.

The arc resistant crackstop structures of the present disclosure can be manufactured in a number of ways using a number of different tools. In general, though, the methodologies and tools are used to form structures with dimensions in the micrometer and nanometer scale. The methodologies, i.e., technologies, employed to manufacture the arc resistant crackstop structures of the present disclosure have been adopted from integrated circuit (IC) technology. For example, the structures are built on wafers and are realized in films of material patterned by photolithographic processes on the top of a wafer. In particular, the fabrication of the arc resistant crackstop structures uses three basic building blocks: (i) deposition of thin films of material on a substrate, (ii) applying a patterned mask on top of the films by photolithographic imaging, and (iii) etching the films selectively to the mask.

Figure 1:
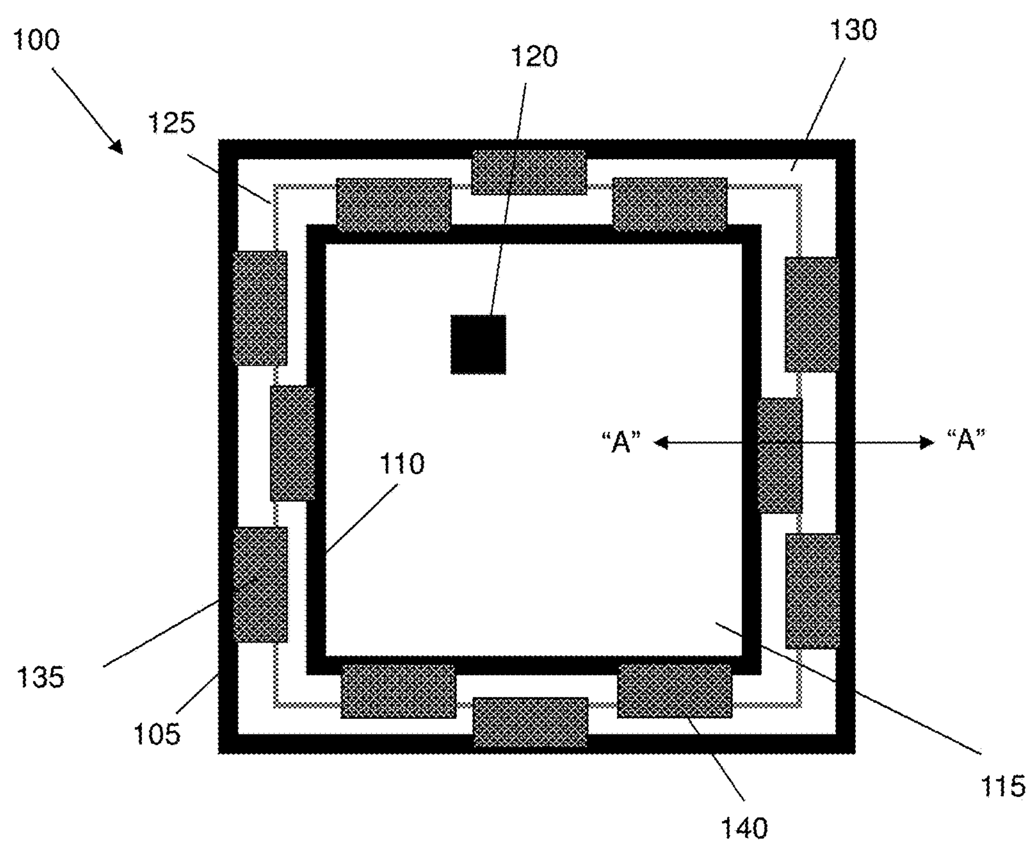
FIG. 1 shows a top plan view of a dual rail crackstop with BOx contact and fabrication processes in accordance with aspects of the present disclosure.

FIG. 1 shows a top plan view of a dual rail crackstop with BOx contact, amongst other features, in accordance with aspects of the present disclosure. In embodiments, the arc resistant crackstop structure 100 shown in FIG. 1 is dual rail crackstop structure comprising an outer rail 105 and an inner rail 110. Although not a limiting feature, the outer rail 105 and the inner rail 110 can be about 12 microns in width as one illustrative example. In embodiments, the outer rail 105 and the inner rail 110 surround an active area 115 of an integrated circuit. The active area 115 can include a plurality of active and/or passive components as represented by reference numeral 120. These active and/or passive components 120 can include, for example, transistors, resistors, capacitors, wiring layers, etc., fabricated using conventional CMOS technologies as should be understood by those of skill in the art.

In embodiments, the outer rail 105 and the inner rail 110 are two non-intersecting crackstop rails comprised of conductive material such as, e.g., copper, tungsten, or aluminum based metallurgies, with one rail running on each side of a through-BOx electrical contact structure 125. In other words, the through-BOx electrical contact 125 can be formed between the outer rail 105 and the inner rail 110. In embodiments, other locations are also contemplated herein for the through-BOx electrical contact 125, e.g., the through-BOx electrical contact 125 can extend on an outside perimeter of the outer rail 105 or an inside perimeter of the inner rail 110 or combinations thereof. It should be noted, though, that the placement of the through-BOx electrical contact structure 125 should be such that connection to both the outer rail 105 and the inner rail 110 is possible, without interfering with other structures of the integrated circuit.

Still referring to FIG. 1, the through-BOx electrical contact 125 is electrically connected to an underlying substrate 130, e.g., semiconductor material (and the rails 105, 110). In embodiments, the substrate 130 can be any high resistivity semiconductor material used in silicon-on-insulator (SOI) technologies. It should also be understood, as the name implies, the through-BOx electrical contact 125 is a contact that extends through an oxide or other insulator layer of the SOI technology, electrically contacting to the underlying substrate 130. In embodiments, the through-BOx electrical contact 125 is fabricated from conductive material, e.g., a tungsten bar or a tungsten bar over a polysilicon stripe, which runs along the perimeter of an area of the integrated circuit.

As further shown in FIG. 1, a plurality of metal tabs 135, 140 electrically extend (connect) from the crackstop rails, e.g., the outer rail 105 and the inner rail 110, to the through-BOx contact structure 125. The metal tabs 135, 140 can be fabricated from any conductive material, and preferably tungsten, copper or aluminum. In embodiments, the metal tabs 135, 140 do not touch each other. The metal tabs 135, 140 can be approximately 5 microns in width and spaced apart at approximately 50 microns; although other dimensions are also contemplated herein.

In more specific embodiments, the metal tabs 135 electrically connect the outer rail 105 to the through-BOx contact structure 125; whereas, the metal tabs 140 electrically connect the inner rail 110 to the through-BOx contact structure 125. In embodiments, the metal tabs 135 can be placed at different locations than the metal tabs 140 to ensure that they do not contact each other. For example, taking a single side of the arc resistant crackstop structure 100, the metal tabs 135, 140 can alternate between one and two contacts per side for the connection to the outer rail 105 and the inner rail 110, respectively. In alternative embodiments, a single metal tab can be used per side, per rail connection, or multiple metal tabs 135, 140 can be used per side, per rail connection, etc. In further embodiments, the multiple metal tabs 135, 140 are evenly spaced apart to equalize any potentials.

In any of these configurations, though, it is now possible to avoid rail-to-rail arcing of crackstops by allowing the rails 105, 110 to float to the same potential by using the common contact, e.g., the through-BOx contact structure 125, to the substrate 130. In addition, as the rails 105, 110 are not connected directly to one another, there is no loss of crackstop redundancy. Moreover, by electrically connecting the through-BOx contact structure 125 between the rails 105, 110 and the substrate 130, it is now possible to eliminate any potential differences that may occur during plasma processing, in addition to reducing any reflected power excursions or defect creation during manufacturing processing. Further, arcing susceptibility for high resistivity SOI substrates is decreased by connecting the rails 105, 110 to the substrate 130 by the through-BOx contact structures 125.

Figure 2:
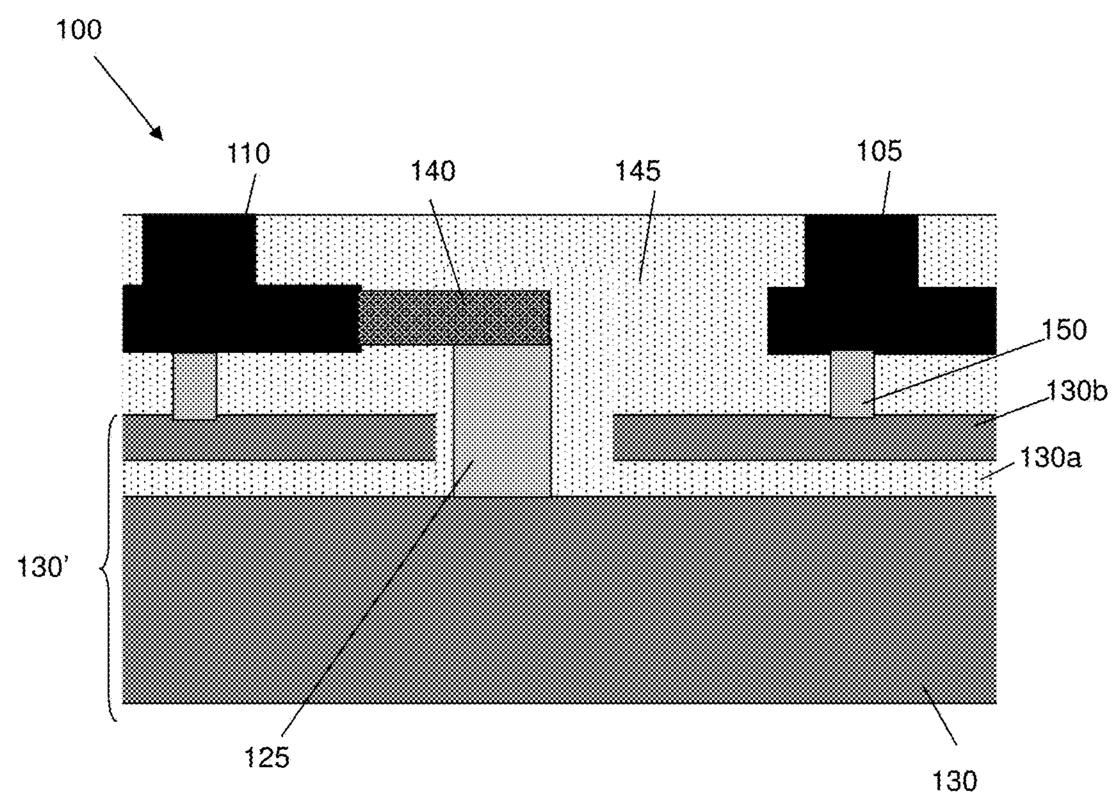
FIG. 2 shows a cross-sectional view of a dual rail crackstop with BOx contact along line A-A of FIG. 1, amongst other features, and respective fabrication processes in accordance with aspects of the present disclosure.

FIG. 2 shows a cross-sectional view of a dual rail crackstop with BOx contact along line A-A of FIG. 1, amongst other features, and respective fabrication processes in accordance with aspects of the present disclosure. More specifically, the structure 100 shown in FIG. 2 includes an SOI substrate 130'. The SOI substrate 130' includes the substrate 130, an oxide or other insulator layer **130*a* (e.g., BOx) and a semiconductor layer 130*b*. The semiconductor layer 130*b* can be any suitable semiconductor material including, but not limited to, Si, SiGe, SiGeC, SiC, GaAs, InAs, InP, and other III/V or II/VI compound semiconductors. In embodiments, the SOI substrate 130'** can be manufactured using any conventional fabrication processes, e.g., SiMOX or wafer bonding techniques.

Still referring to FIG. 2, the outer rail 105 and the inner rail 110 are formed through multiple layers of insulator material 145 of the integrated circuit, e.g., different metal layers. In embodiments, the outer rail 105 and the inner rail 110 can be formed by conventional CMOS techniques during the fabrication of the different wirings and via interconnects. In embodiments, a contact 150 can be formed at the first wiring layer, connecting the rails 105, 110 to the suitable semiconductor material **130*b*. The contacts 150** can also be formed at other levels of the device in the manner described herein.

For example, taking a single metallization level as an illustration, the metallization structures, e.g., wiring structures, interconnect structures, rails 105, 110 and contacts 150, can be formed by conventional lithography, etching and deposition methods known to those of skill in the art. More specifically, a resist formed over insulator material 145 (at the particular level of the integrated circuit) is exposed to energy (light) to form a pattern (opening). An etching process with a selective chemistry, e.g., reactive ion etching (RIE), will be used to form one or more trenches in the insulator material 145 through the openings of the resist. Following the resist removal, the conductive material, e.g., tungsten, etc., can be deposited by any conventional deposition processes, e.g., chemical vapor deposition (CVD) processes. Any residual material on the surface of the insulator material 145 can be removed by conventional chemical mechanical polishing (CMP) processes.

FIG. 2 further shows the through-BOx contact structure 125 electrically connecting between the rail 110 and the substrate 130, via the metal tab 140. In embodiments, to form the through-BOx contact structure 125, a trench is formed through insulator material 145 (at an appropriate wiring level), the oxide or other insulator layer **130*a* (e.g., BOx) and the semiconductor layer 130*b*, to expose the substrate 130. In embodiments, the trench can also be formed into the substrate 130. Following trench formation (as described herein), the conductive material, e.g., tungsten or tungsten over a polysilicon stripe, is then deposited within the trench. The deposition process can be, e.g., a CVD process. Any residual material can then be removed from a surface of the insulator material 145** (at the appropriate level) using a CMP process, as an example.

The metal tab 140 (and other metal tabs 135) can then be formed in electrical contact with the rail 110 in a similar manner as described herein. It should also be noted that the metal tab 140 (and other metal tabs 135) can be formed in a dual damascene process with the rails. Also, it should be noted that although the metal tab 140 is shown to be connected to the rail 110 and the through-BOx contact structure 125 at the lower wiring level, it is possible to have this connection at any level of the device which does not interfere with other circuitry.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:

a crackstop structure comprising dual rails surrounding an active area of an integrated circuit; and a through-BOx electrical contact electrically connecting each of the dual rails to an underlying substrate, wherein the dual rails include an outer rail and an inner rail and the through-BOx electrical contact is composed of a tungsten bar over a polysilicon stripe, which runs along a perimeter of an area of the integrated circuit.

2. The structure of claim 1, wherein the through-BOx electrical contact is positioned between the outer rail and the inner rail.

3. The structure of claim 1, wherein the through-BOx electrical contact is composed of a tungsten bar extending through an insulator layer of a silicon-on-insulator (SOI) technology.

4. The structure of claim 1, wherein the outer rail and the inner rail are non-intersecting metal crackstop rails which are electrically isolated from one another.

5. The structure of claim 4, wherein the non-intersecting metal crackstop rails are composed of copper, tungsten, or aluminum based metallurgies.

6. A structure, comprising:

a crackstop structure comprising dual rails surrounding an active area of an integrated circuit; and a through-BOx electrical contact electrically connecting each of the dual rails to an underlying substrate, a plurality of tabs extending from the non-intersecting metal crackstop rails and electrically contacting the through-BOx contact structure, but not each other, wherein the dual rails include an outer rail and an inner rail, the outer rail and the inner rail are non-intersecting metal crackstop rails which are electrically isolated from one another.

7. The structure of claim 6, wherein the plurality of tabs are equally spaced from one another.

8. The structure of claim 6, wherein separate tabs of the plurality of tabs are electrically connected to the outer rail and the inner rail.

9. The structure of claim 1, wherein the underlying substrate is silicon-on-insulator (SOI) technology and the through-BOx electrical contact extends through a semiconductor material and insulator layer of the SOT technology to electrically connect to the underlying substrate.

10. The structure of claim 1, wherein the dual rails have a common through-BOx electrical contact.

11. A structure, comprising:

non-intersecting metal crackstop rails comprising an outer crackstop structure surrounding an active area of an integrated circuit and an inner crackstop structure surrounding the active area of the integrated circuit;

a through-BOx electrical contact electrically connecting each of the outer crackstop structure and the inner crackstop structure to an underlying substrate of silicon-on-insulator technology; and a plurality of tabs extending from the non-intersecting metal crackstop rails and electrically contacting the through-BOx contact structure, but not each other.

12. The structure of claim 11, wherein the through-BOx electrical contact is positioned between the outer crackstop structure and the inner crackstop structure.

13. The structure of claim 11, wherein the through-BOx electrical contact is composed of a tungsten bar extending through an insulator layer of the SOI technology.

14. The structure of claim 11, wherein the through-BOx electrical contact is composed of a tungsten bar over a polysilicon stripe.

15. The structure of claim 11, wherein the outer crackstop structure and the inner crackstop structure are electrically isolated from one another.

16. The structure of claim 11, wherein the through-BOx electrical contact extends through a semiconductor material and insulator layer of the SOI technology to electrically connect to the underlying substrate.

17. A method comprising forming a through-BOx electrical contact through an insulator layer and semiconductor layer of an SOI technology to electrically connect non-intersecting metal crackstop rails to an underlying substrate and forming a plurality of tabs extending from the non-intersecting metal crackstop rails and electrically contacting the through-BOx contact structure, but not each other.

* * * * *